United States Patent [19]

Choi

[11] Patent Number: 5,789,294

[45] Date of Patent: Aug. 4, 1998

[54] MANUFACTURING METHOD OF NONVOLATILE MEMORY

[75] Inventor: Jeong-Hyuk Choi, Seoul, Rep. of Korea

[73] Assignee: Samsung Electronics Co., Ltd., Kyungki-do, Rep. of Korea

[21] Appl. No.: 613,941

[22] Filed: Mar. 13, 1996

[30] Foreign Application Priority Data

Mar. 22, 1995 [KR] Rep. of Korea ............ 95-6110

[51] Int. Cl.$^6$ ............................................. H01L 21/8247
[52] U.S. Cl. ............................................. 438/258
[58] Field of Search ............ 437/43, 52; 438/257, 438/258

[56] References Cited

U.S. PATENT DOCUMENTS

| | | | |
|---|---|---|---|
| 5,223,451 | 6/1993 | Uemura et al. | 437/154 |
| 5,449,634 | 9/1995 | Inoue . | |
| 5,538,912 | 7/1996 | Kunori et al. | 437/43 |
| 5,550,072 | 8/1996 | Cacharelis et al. | 437/43 |

OTHER PUBLICATIONS

Ghandhi, "VLSI Fabrication Principles Silicon and Gallium Arsenide", John Wiley and Sons Inc., pp. 527–535, 1994.
Wolf, "Silicon Processing for the VLSI Era vol. 2: Process Integration", Lattice Press, pp. 194–196, 1990.

Primary Examiner—John Niebling
Assistant Examiner—Richard A. Booth
Attorney, Agent, or Firm—Cushman Darby & Cushman IP Group of Pillsbury Madison & Sutro LLP

[57] ABSTRACT

A manufacturing method of a nonvolatile memory includes the steps of forming a field oxide film on a Cell Region (CR) and a Peripheral circuit Area (PA) of a semiconductor substrate, and then defining an active region, sequentially forming a tunneling oxide film, a lower gate, and a gate insulating film, eliminating the gate insulating film, the lower gate, and tunneling oxide film on the PA, and then forming a gate oxide film on the substrate, forming an upper gate and an upper insulating film on the whole surface of the semiconductor substrate, etching the upper insulating film and the upper gate simultaneously (in the first embodiment) or separately (in the second embodiment), and then forming a single layer gate pattern and a stack gate pattern on the PA and on the CR, respectively, etching the gate insulating film and the lower gate on the CR by using a stack gate pattern, forming an interlayer dielectric film on the semiconductor substrate, and then forming a metallic wiring. Thus, a function of detecting an end point can be prevented from lowering, a process can also be simplified, and further a loss of the field oxide film can be minimized, so that it is possible to prevent the device isolation characteristics from being reduced and damage of the substrate can be prevented.

8 Claims, 9 Drawing Sheets

MANUFACTURING METHOD OF NONVOLATILE MEMORY

BACKGROUND OF THE INVENTION

The present invention relates to a manufacturing method of a semiconductor device, and more particularly, to a manufacturing method of a nonvolatile memory, wherein the aspect ratio (A/R) is decreased and the manufacturing process is simplified.

A nonvolatile memory typically includes a stack gate cell array region, formed of memory cells for storing data, having a floating gate and a control gate, and a peripheral circuit area (here-in-after called PA) for driving the memory cells. The PA is generally formed of transistors having a single layer gate electrode structure.

In a conventional method for manufacturing a stack gate cell and a single layer gate transistor (see U.S. Pat. No. 5,223,451, "Semiconductor device wherein n-channel MOSFET, p-channel MOSFET and nonvolatile memory cell are formed in one chip and method of making it"), each cell has an independent floating gate. In this conventional method for manufacturing a stack gate cell and a single layer gate transistor, the floating and control gates which constitute a stack gate type memory cell are patterned without being misaligned. Accordingly, tunneling oxide and polysilicon film, for the floating gate, are deposited on a semiconductor substrate. Then, a polysilicon film pattern is formed in a parallel direction to the bit line. A gate insulating film, for insulating the floating gate and the control gate, and a polysilicon film, for the control gate, are sequentially deposited, thereafter the whole surface is coated with photoresist.

Subsequently, the photoresist is patterned in a direction of a wordline (W), which is a vertical direction to the bit line. The polysilicon for the control gate, the gate insulating film, and the polysilicon film for the floating gate are sequentially etched by using the photoresist pattern as a mask through self-aligning. Further, in order to form the single layer gate of the PA, a Cell Region (here-in-after called CR) is masked with another mask, and then the gate of the PA is patterned.

In the above described conventional method, the A/R of the etched pattern increases as the thicknesses of the photoresist for stack gate patterning and of the etched stack gate are increased. Accordingly, it is more difficult to form a minimum pattern than a single gate case. To solve this problem, an insulating film instead of photoresist is formed on the control gate to a thickness of 4000 Å. This is a considerable decrease in thickness when compared to a usual photoresist thickness of 1.0 μm. The insulating film is patterned by using the photoresist to form a mask. Thus, a design rule of 0.4 μm or less is realized by such an insulating film masking method where the control gate and the polysilicon layer for the floating gate are etched using the patterned insulating film as a mask.

To demonstrate the effectiveness of reducing the A/R by using an insulating film, an example is discussed below. In the case of forming a pattern with a floating gate, a gate insulating film and a control gate, with the thicknesses of 1500 Å, 300 Å, and 2000 Å, respectively, either a 1.4 μm thick photoresist or a 4000 Å thick insulating film mask can be used. With the use of a photoresist, the A/R is 1.78 μm/0.4 μm=4.45. Whereas, with the use of an insulating film mask, the A/R is 1.78 μm/0.4 μm=1.95.

A conventional manufacturing method of a nonvolatile memory, where gates of a cell array and the PA are patterned by using a material that has an excellent selectivity to an insulating film or a layer to be etched as described above, will now be described.

Figure 1:
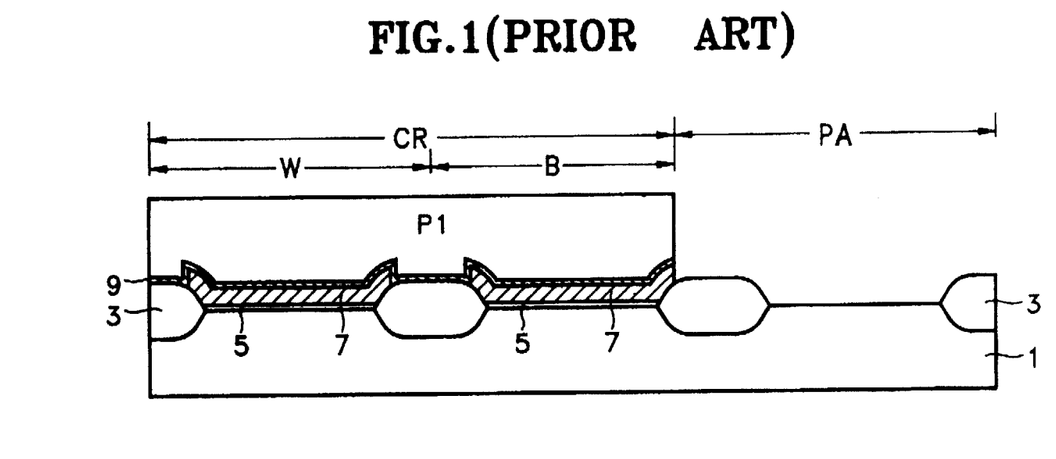
FIGS. 1 through 5 are views showing a manufacturing method of a nonvolatile memory by the conventional method.
Figure 2:
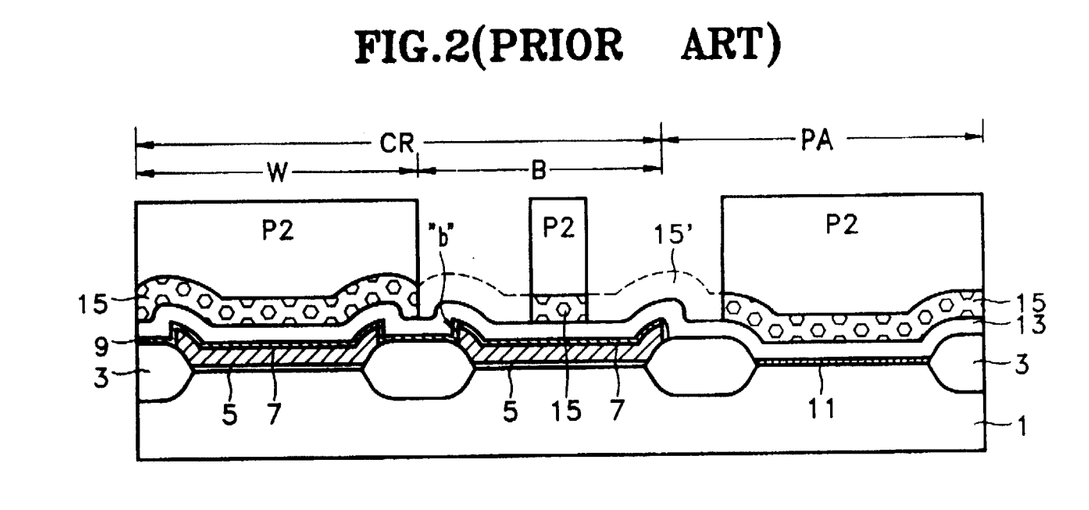

FIG. 1 shows the step of forming gate insulating film 9 on the CR. In detail, field oxide film 3 is formed on semiconductor substrate 1 by the usual LOCOS method. Then, tunneling oxide 5 is grown on an active region between field oxide films 3. Subsequently polysilicon film 7 (a lower gate) is deposited on the whole surface of the semiconductor substrate. Then, the semiconductor substrate is doped with conductive impurities. The exposed polysilicon film on a defined part of field oxide film 3 on the CR is etched. Insulating film 9 (a gate insulating film) for insulating lower gate 7 and upper gate 13, shown in FIG. 2, is formed on the whole surface of the resultant structure. The CR is defined by a photoresist pattern (P1) in order to form a gate oxide film of a transistor on the PA. Then, gate insulating film 9 and lower gate 7 and tunneling oxide 5 of the PA are sequentially eliminated.

Tunneling oxide film 5 is grown to a thickness of approximately 100 Å. Lower gate 7 used as a floating gate is formed to a thickness of 1,500 Å. Next, phosphorus is doped by using POCL$_3$ as a dopant for reducing resistance. Finally, gate insulating film 9 is formed of an oxide-nitride-oxide (ONO) film.

FIG. 2 shows the step of forming upper gate 13 and upper insulating film mask 15. In detail, gate insulating film 11 is grown on an active region between field oxide films 3 of the PA. Then, polysilicon film 13 is formed on the whole surface of semiconductor substrate 1 of the resultant structure. Insulating film 15 (an upper insulating film) is formed on polysilicon film 13 (upper gate) by a CVD method. Then, a photoresist pattern (P2) which defines upper insulating film 15 in the wordline (W) direction is formed thereon. Reference numeral 15' represents the part where upper insulating film 15 is eliminated. Further, the P2 is also eliminated.

Upper gate 13 plays the role of a control gate in the nonvolatile memory. Upper gate 13 can also be formed of a doped polysilicon film or a polycide.

Figure 3:
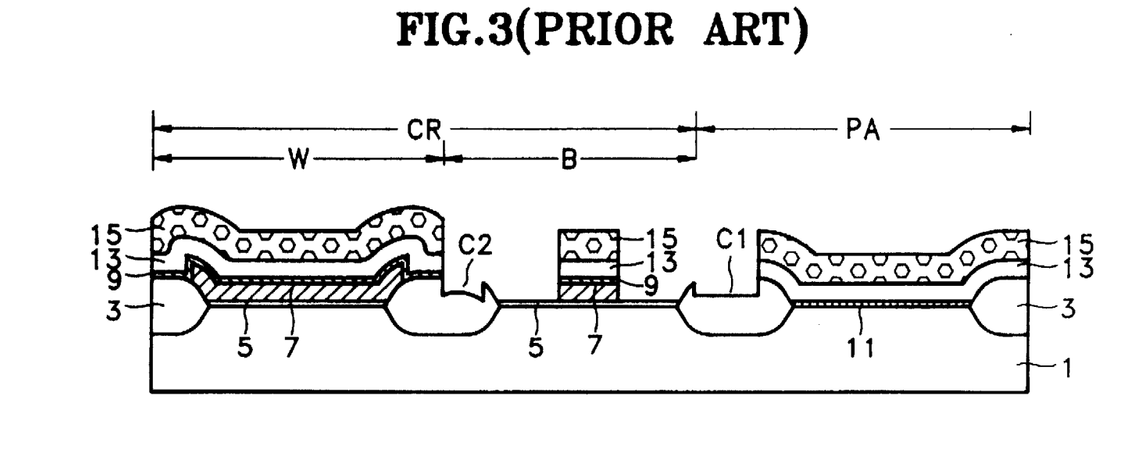

FIG. 3 shows the step of forming a stack gate on the CR. In detail, when the whole surface of the resultant structure is etched using patterned upper insulating film 15 as a mask, a stack gate consisting of upper gate 13, gate insulating film 9, and lower gate 7 is formed on an active region of the CR in the bit line (B) direction. Field oxide film 3 is also etched while gate insulating film 9 and lower gate 7 on the active region are etched after upper gate 13 is eliminated. Thus, overetched regions C1 and C2 are formed on field oxide film 13.

Figure 4:
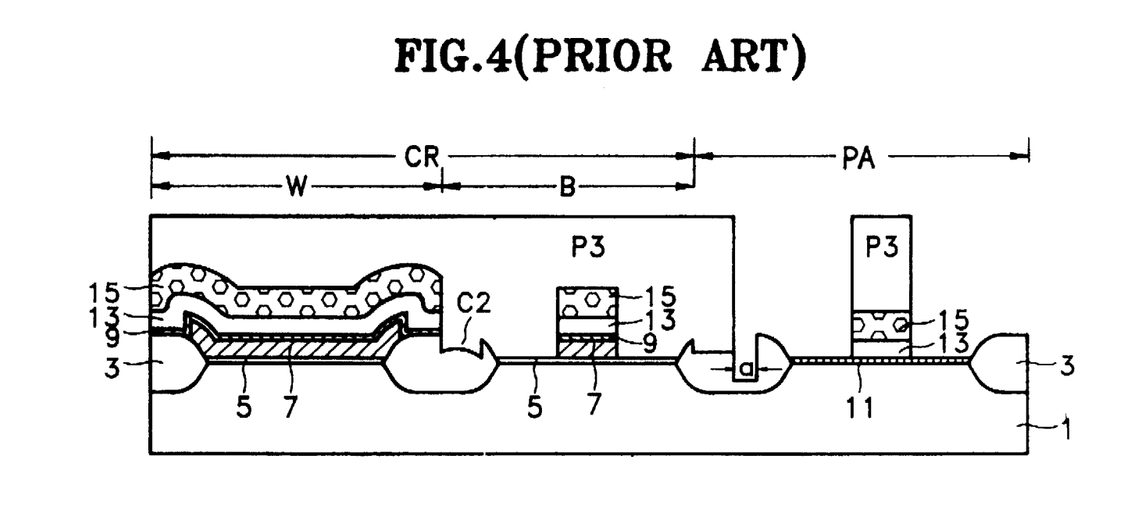

FIG. 4 shows the step of forming a single layer gate electrode on the PA. In detail, a photoresist pattern (P3) is formed over all of the CR, a part of the overetched region C1 of the field oxide film on a common part of the CR and PA, and a part of the gate electrode that is to be formed on the PA, which are all defined on the resultant structure. The whole surface of the resultant structure is etched by using the P3. As a result, exposed upper insulating film 15 and upper gate 13 are sequentially etched, whereby a single layer gate electrode is formed on the PA. A part "a" of etched field oxide film C1 of FIG. 3 is further exposed to etching. Subsequently, the P3 is eliminated.

Figure 5:
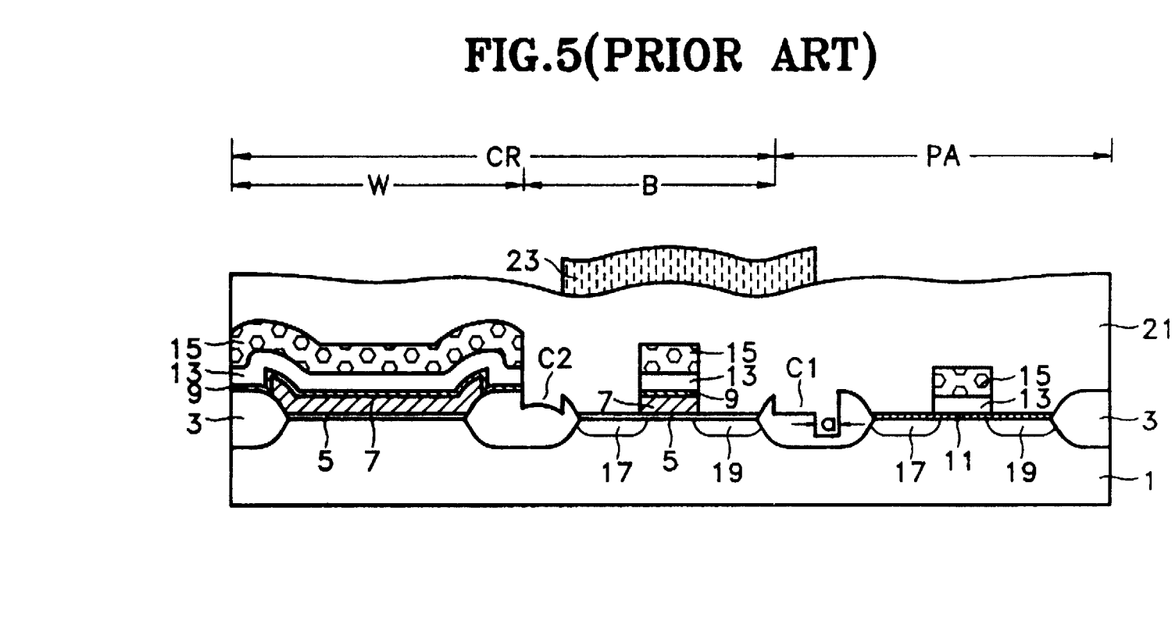

FIG. 5 shows the final process. In detail, conductive impurities are ion-implanted into the whole surface of the resultant structure, thereby forming drain/source regions 17 and 19 in the CR and PA. An interlayer dielectric film 21 is deposited on the whole surface of the resultant structure and reflowed, thus planarizing the resultant structure. A metal connector 23 is formed on planarized interlayer dielectric film 21.

By the conventional manufacturing method of a nonvolatile memory, the A/R is reduced by using an upper insulating film as a mask, but the field oxide film is overetched. Field oxide film located in a boundary area of the PA in FIG. 4, is exposed during the overetching process for eliminating an ONO film "b" of the sidewalls of the lower gate, shown in FIG. 2, and the lower gate, thereby to be first-etched. Further, the field oxide film is exposed during the etching of the upper insulating film and the lower gate, thereby to be second-etched. As a result, a groove having a depth of "a" is formed on the field oxide film located in the boundary area between the CR and PA. Accordingly, when the field oxide film is overetched, either the bulk silicon is damaged or the impurities are implanted into an active region in the exposed field oxide film during ion-implantation, or the characteristics of device isolation and threshold voltage, during the forming of a field transistor, are reduced. In a highly-integrated memory, as the area ratio of the CR in a chip increases, the PA is relatively reduced. When the lower gate on the reduced PA is completely etched during the dry-etching process used for forming a gate pattern, a function of detecting an end point that is recognized by an etched degree of the gate insulating film therebelow is lowered. Accordingly, the etching should be performed for predetermined periods of time, where overetching or underetching can occur when a thickness of the formed lower gate or a condition of process is changed.

SUMMARY OF THE INVENTION

Accordingly, it is an object of the present invention to provide a manufacturing method of a nonvolatile memory wherein the A/R is reduced by using an insulating film mask, so that a fine pattern can be formed, the whole process can be simplified by reducing the number of etchings, and deterioration of device isolation characteristics and substrate damage due to loss of a field oxide film can be prevented.

To accomplish the above objects of the present invention, there is provided a manufacturing method of a nonvolatile memory according to a first embodiment of the present invention, comprising the steps of; forming a field oxide film on a CR and a PA of a semiconductor substrate, and then defining an active region; forming a tunneling oxide film of the active region; forming a lower gate on the semiconductor substrate; eliminating a defined part of the lower gate on the CR; forming a gate insulating film on the whole surface of the semiconductor substrate; eliminating the gate insulating film, the lower gate, and the tunneling oxide film on the PA; forming a gate oxide film on the PA; forming an upper gate and an upper insulating film on the whole surface of the semiconductor substrate; etching the upper insulating film and the upper gate on CR and PA to form a gate mask and a single layer gate pattern; etching the gate insulating film and the lower gate on the CR by using the gate mask, and then forming a stack gate pattern; forming source/drain regions on the semiconductor substrate; forming an interlayer dielectric film on the whole surface of the semiconductor substrate; and forming a metallic wiring on the interlayer dielectric film.

To accomplish the above object of the present invention, there is provided a manufacturing method of a nonvolatile memory according to a second embodiment of the present invention, comprising the steps of; forming a field oxide film on a CR and a PA of a semiconductor substrate to define an active region; forming a tunneling oxide film on the active region; forming a lower gate on the semiconductor substrate; eliminating a defined part of the lower gate on the CR; forming a gate insulating film on the whole surface of the semiconductor substrate; eliminating the gate insulating film, the lower gate, and the tunneling oxide film on the PA; forming a gate oxide film of the PA; forming an upper gate and an upper insulating film on the whole surface of the semiconductor substrate; patterning the upper insulating film on the CR and PA to form a mask; etching the upper gate by using the patterned upper insulating film as a mask to form a gate mask pattern on the CR and a single layer gate pattern on the PA; etching the gate insulating film and the lower gate on the CR by using the gate mask pattern to form a stack gate pattern; forming source/drain regions on the semiconductor substrate; forming an interlayer dielectric film on the whole surface of the semiconductor substrate; and forming a metallic wiring on the interlayer dielectric film.

It is preferable to form the field oxide films in the first and second embodiments to a thickness of 5,000 Å in order to obtain a sufficient insulation characteristic. It is also preferable to grow the tunneling oxide film to a thickness of 100 Å.

It is preferable that the lower gate is formed to a thickness of 1,500 Å and doped with $POCL_3$ in order to reduce the resistance.

Lower gates of the CR are defined in order to isolate the lower gates per cell, where a partial region of a field oxide film, which is situated in a parallel direction to a bit line, is also included.

It is preferable to form the gate insulating film by an ONO film having each respective thicknesses of 80/120/30 Å.

The gate oxide film is formed to a thickness of 120 Å.

The upper gate consists of a polycide film where tungsten silicide ($WSiO_2$) is formed on the doped lower gate to a thickness of approximately 1,500 Å in order to reduce further resistance. The upper insulating film is formed of an oxide or nitride film to a thickness of 4,000 Å, by a CVD or plasma process. The upper insulating film can be patterned by coating photoresist to a thickness of 1.4~0.7 μm in order to reduce the A/R.

According to the present invention, it is possible to form a fine pattern by reducing the A/R and to simplify the manufacturing process by reducing the number of etchings, through the use of an insulating film. Accordingly, it is possible to prevent the characteristics of device isolation from being reduced or the substrate from being damaged, due to partial-etching of the field oxide film.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 6:
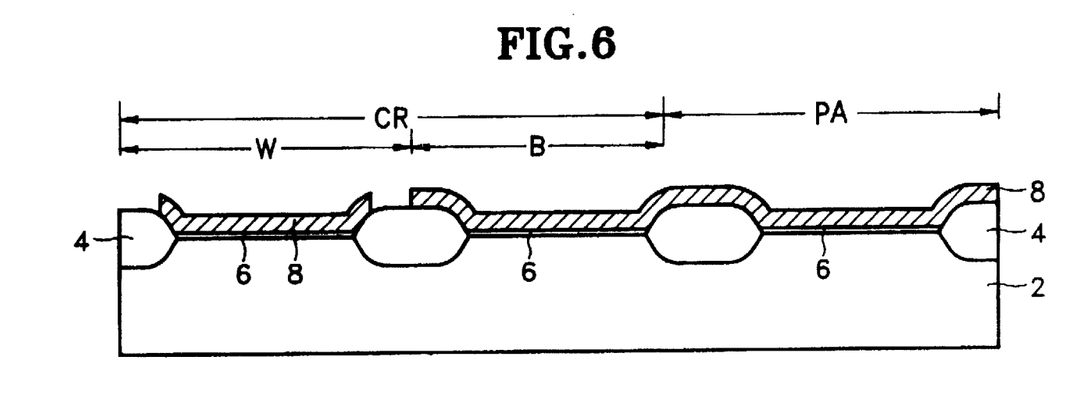
FIGS. 6 through 10 are views showing a manufacturing method of a nonvolatile memory according to a first embodiment of the present invention.

FIG. 6 shows the step of forming lower gate 8. In detail, field oxide film 4 is formed on semiconductor substrate 2, to thereby define an active region and an inactive region of a CR and a PA. Subsequently, when the active region is field-oxidized through both sacrifice oxidation and wet etching processes, stress or white ribbon defects t an edge of field and active regions are eliminated. A tunneling oxide film 6 is formed on the active region. Lower gate 8 is formed on the whole surface of the semiconductor substrate, and then a predetermined part on field oxide film 4 of the CR in the bit line directions is eliminated. Tunneling oxide film 6 is then formed to a thickness of approximately 100 Å and field oxide film 4 to a thickness of approximately 5,000 Å. Further, lower gate 8, used as a floating gate, is formed by a polysilicon film to a thickness of approximately 1,500 Å. Lower gate 8 is doped with phosphorus (P) by using $POCL_3$ in order to reduce resistance.

Figure 7:
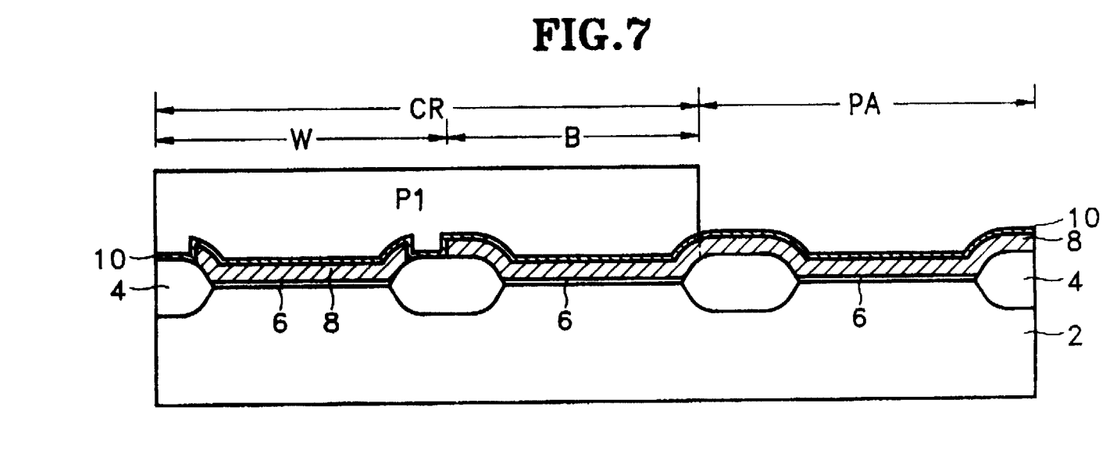

FIG. 7 shows the step of defining the CR. In detail, insulating film 10 is formed on the whole surface of the resultant structure. Then, a photoresist pattern (P1) for defining the whole surface of the CR is formed on semiconductor substrate 2. When the whole surface of the semiconductor substrate is etched by using the P1 as a mask, gate insulating film 10 and lower gate 8 and tunneling oxide 6 in the PA are eliminated. Also, P1 is eliminated. Lower gate 8, gate insulating film 10, and upper gate 14, shown in FIG. 8, are formed as an ONO film having respective thicknesses of 80/120/30 Å.

Figure 8:
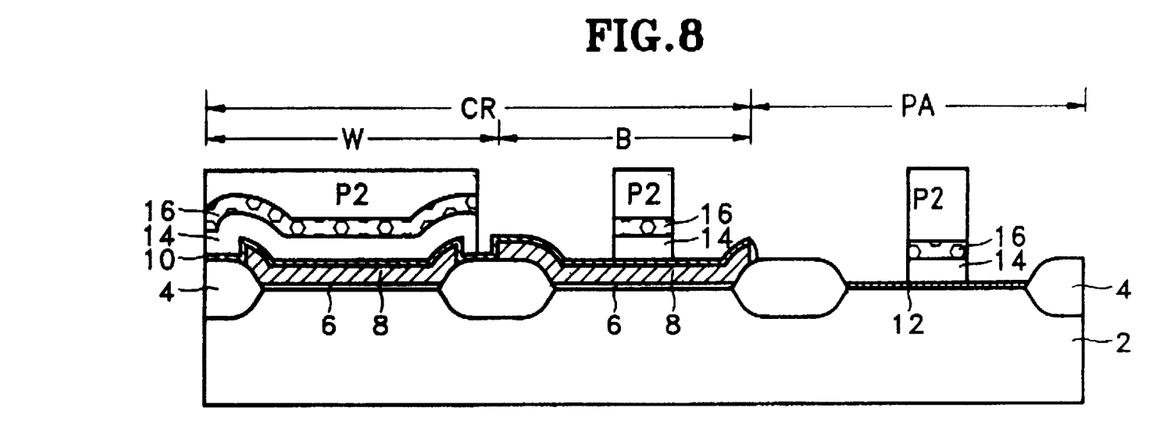

FIG. 8 shows the step of forming a gate mask pattern and a single layer gate pattern in the CR and PA, respectively. In detail, gate oxide film 12 is formed on an active region of the PA. Subsequently, upper gate 14 and upper insulating film 16 are sequentially formed on the whole surface of the resultant structure. The P2 for defining all of the CR of lower gate 8 in the wordline (W) direction and part of CR in the bit line (B) direction, and a part of the active region the PA is formed on upper insulating film 16. Upper insulating film 16 and upper gate 14 are sequentially etched by using the P2. As a result, a single layer gate pattern is formed in the PA, gate insulating film 10 and a gate mask pattern for etching lower gate 8 are formed in the CR. The stack gate is formed by self-aligning, and the P2 is eliminated.

Gate oxide film 12 is formed to a thickness of approximately 120 Å. Upper gate 14 used as a control gate, is formed of polysilicon to a thickness of 1,500 Å. Phosphorus (P) is ion-implanted in order to reduce the resistance. Then, polycide is formed by forming tungsten silicide ($WSi_2$) on the polysilicon layer to a thickness of approximately 1,500 Å, and thus, further resistance can be reduced. Finally, upper insulating film 16 formed of either an oxide film or a nitride film, is formed by a CVD or plasma method to a thickness of approximately 4,000 Å.

Figure 9:
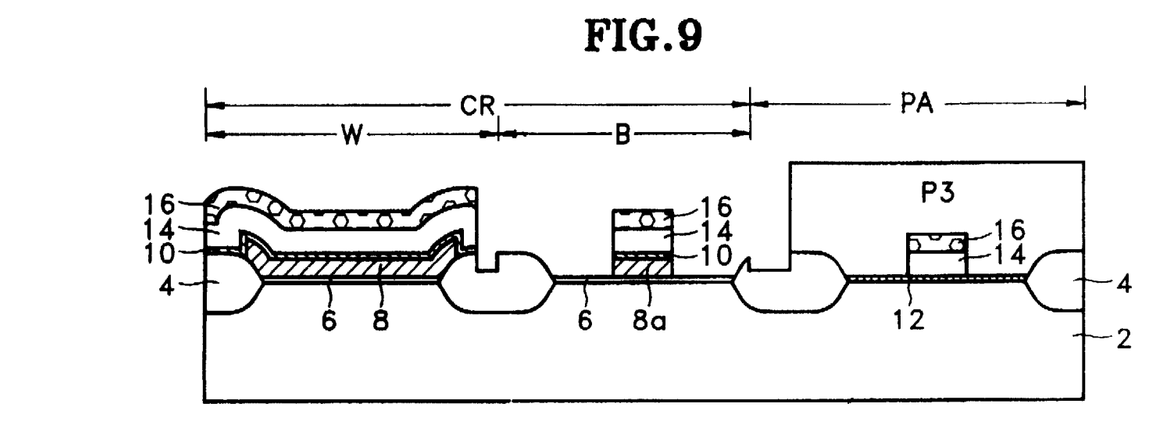

FIG. 9 shows the step of etching lower gate 8. In detail, a photoresist pattern (P3) for defining the PA is formed on the resultant structure. When the whole surface of the resultant structure is etched, gate insulating film 10 and lower gate 8 in the CR are sequentially eliminated, thereby forming lower gate 8a through self-aligning. Accordingly, a stack gate pattern of accumulated upper insulating film 16, upper gate 14, gate insulating film 10, and lower gate 8 is formed. Then, the P3 is eliminated.

Here, field oxide film 4 in a boundary region between the CR and PA, and a field oxide film having a predetermined part of the inside of the cell are exposed by the etching process. According to the etching of the field oxide film, gate insulating film 10 and lower gate 8 are etched, thereby forming a groove on the field oxide film. However, the groove is more stabile and smaller than the groove "a" in FIG. 4 formed by first and second etching.

Figure 10:
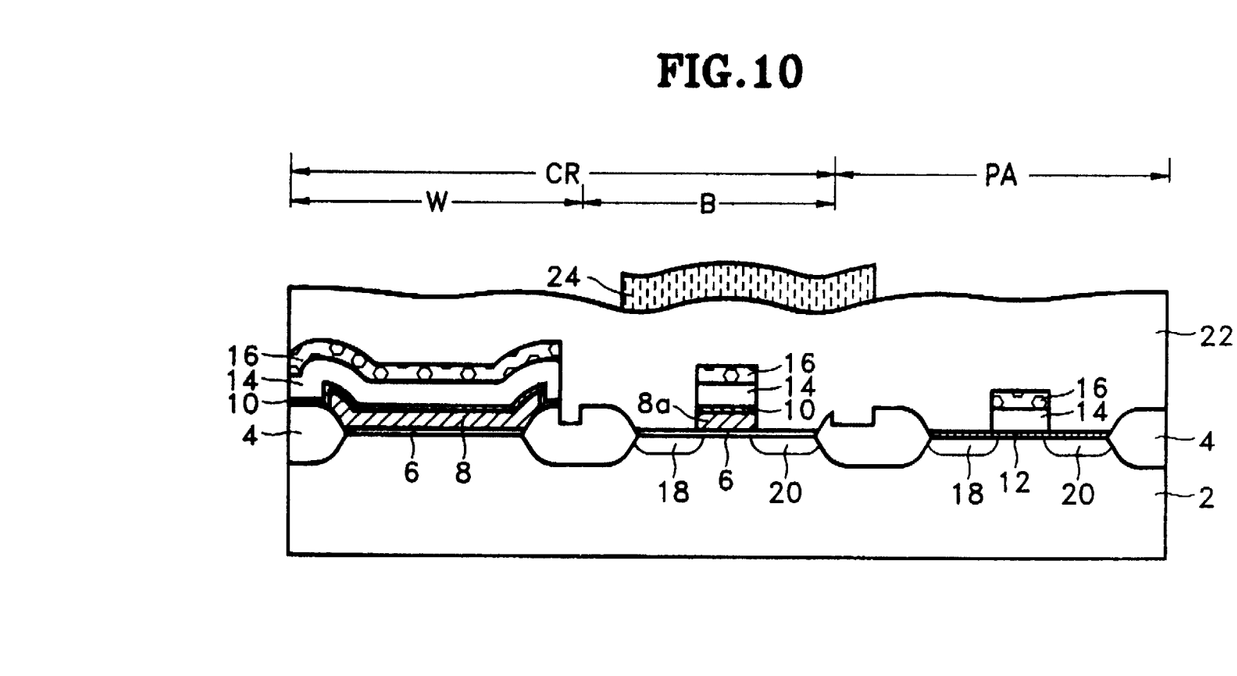

FIG. 10 shows the step of completing the processes. In detail, a conductive material is ion-implanted into the resultant structure, thereby forming source/drain regions 18 and 20. An interlayer dielectric film 22 is deposited on the whole surface of semiconductor substrate 2, and then reflowed, to thereby be planarized. A metal connector 24 is formed on planarized interlayer dielectric film 22.

Interlayer dielectric film 22 is formed of a high temperature oxide or BPSG film, and then planarized at 900° C. for 10 minutes. Further, a contact hole (not shown) for electronic connection is formed.

FIGS. 11 through 15 are views showing a manufacturing method of a nonvolatile memory according to a second embodiment of the present invention.

Figure 11:
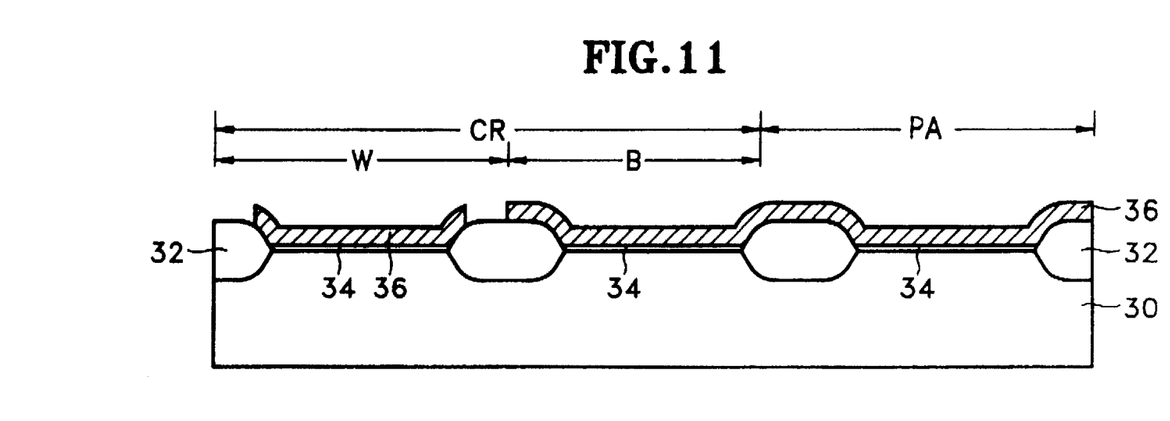
FIGS. 11 through 15 are views showing a manufacturing method of a nonvolatile memory according to a second embodiment of the present invention.
Figure 12:
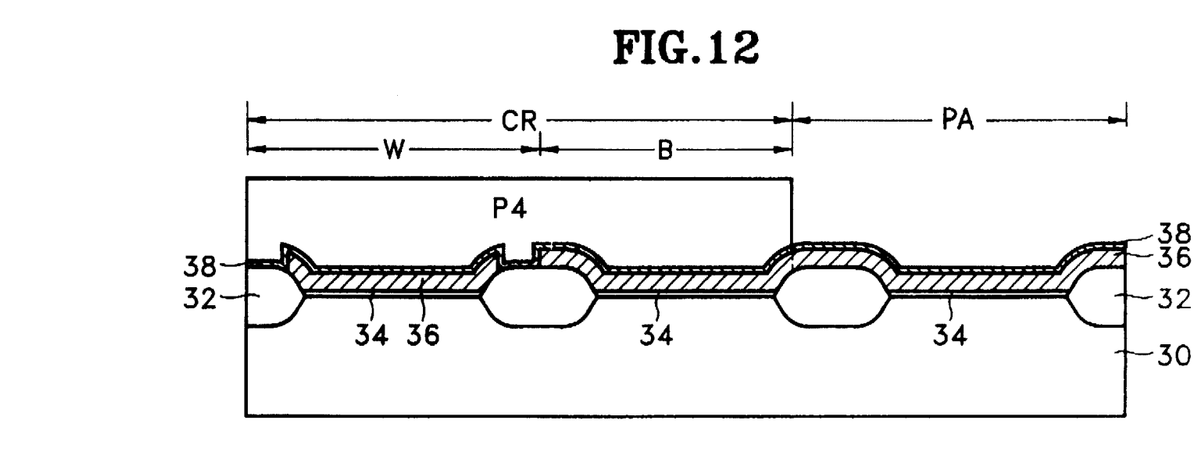

FIGS. 11 and 12 show the same processes as those shown in the first embodiment. The photoresist pattern (P4) of FIG. 12 is the same as the P1 of FIG. 7.

Figure 13:
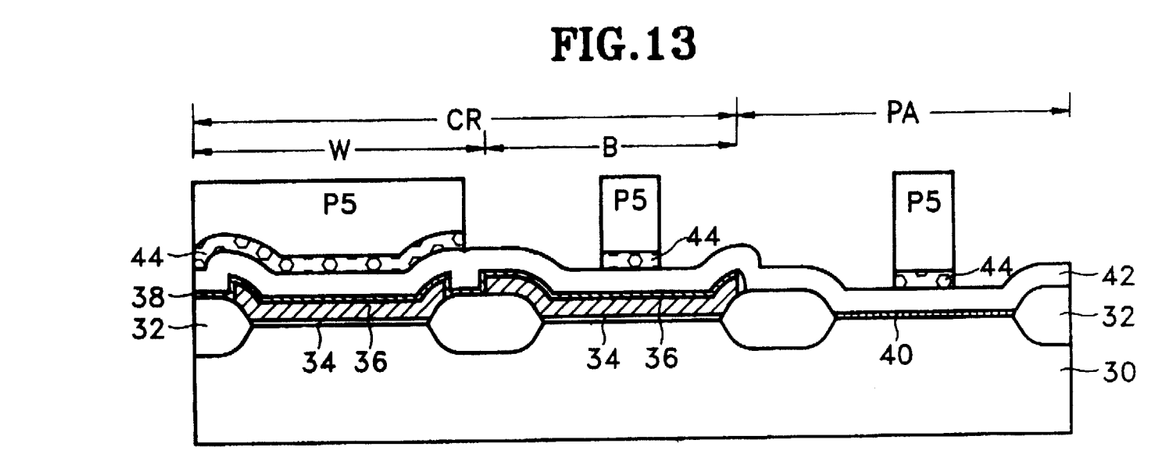

FIG. 13 shows the step of defining upper insulating film mask 44. In detail, gate oxide film 40 is formed on an active region of PA of the resultant structure, as shown in FIG. 12 or FIG. 7. An upper gate 42 and upper insulating film 44 are sequentially formed on the whole surface of the resultant structure. Then, a photoresist pattern (P5) for defining all of the wordlines "W" and a part of bitline "B" of the CR, and a part of the active region of the PA are all formed on upper insulating film 44. The whole surface of the resultant structure is anisotropically etched by using the P5, thereby eliminating insulating film 44 from all parts which are not masked by the P5. Subsequently, the P5 is eliminated. Gate oxide film 40 of the PA, upper gate 42, and upper insulating film 44 are then formed by the same manner as that shown in the first embodiment.

Figure 14:
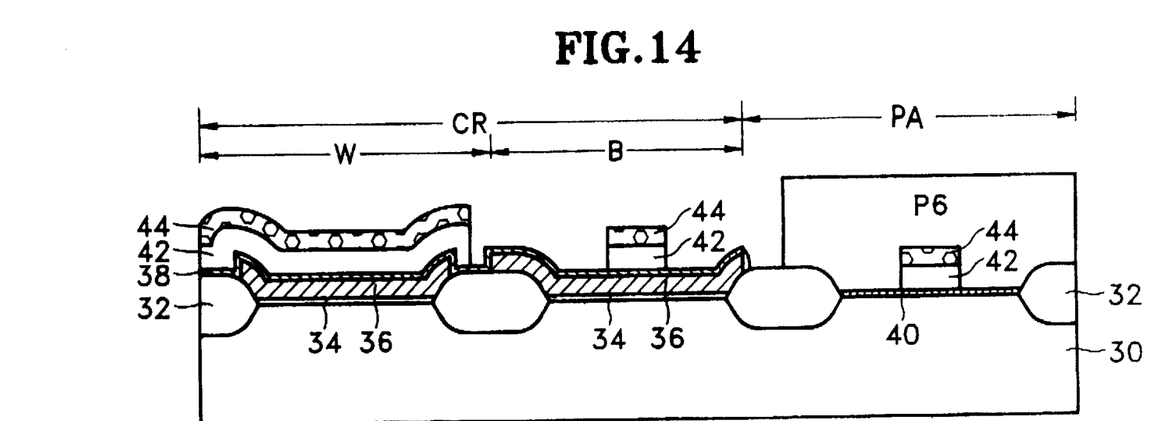

FIG. 14 shows the step of forming a stack gate pattern and a single gate pattern. In detail, upper gate 42 is patterned by self-aligning, by using upper insulating film 44 as a mask. Accordingly, a single gate pattern is formed in the PA, and a stack gate pattern in the CR. Further, a photoresist pattern (P6) is formed, to thereby define the PA.

Figure 15:
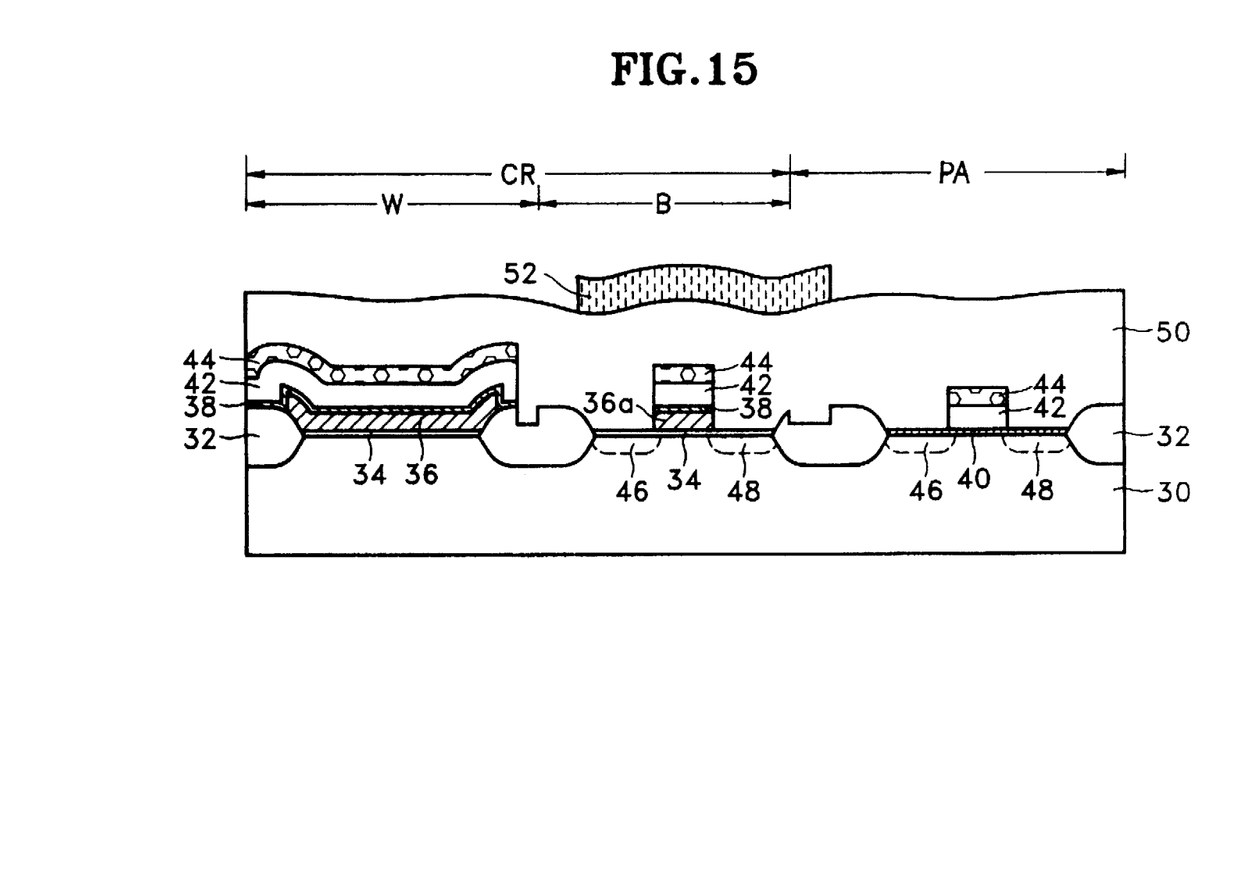

FIG. 15 shows the step of completing the process. In detail, gate insulating film 38 and lower gate 36 are sequentially etched by using the stack gate pattern of the CR as a mask. Then, the P6 is eliminated. When a single layer gate pattern (not shown) is required for the CR, the single layer gate pattern can be formed by forming a photoresist pattern partially defining gate insulating film 38. Successive processes are the same as those shown in FIG. 10.

According to the present invention, the upper insulating film is used as a mask when the stack gate of the CR and the single layer gate of the PA are formed, thereby simultaneously etching an upper gate material in the CR and PA. And, when a gate insulating film and the lower gate in the CR are etched, the A/R is reduced, thereby forming a fine pattern. Accordingly, the processes are simplified by reducing the number of etchings. It is possible to solve the problem of the loss of a field oxide film due to repetitive etching, when the gate patterns on the CR and PA are formed. Therefore, it is possible to prevent the device isolation characteristic from being reduced and the substrate from being damaged, due to partial-etching of the field oxide film.

It should be understood that the invention is not limited to the illustrated embodiments and many changes and modifications can be made within the scope of the invention.

What is claimed is:

1. A manufacturing method of a nonvolatile memory comprising the steps of:

forming a field oxide film on a cell region (CR) and a periphery circuit area (PA) of a semiconductor substrate to define an active region;

forming a tunneling oxide film on said active region to form a first resultant structure;

forming a lower gate on said first resultant structure;

eliminating a defined part of said lower gate on said CR to form a second resultant structure;

forming a gate insulating film on the whole surface of said second resultant structure;

eliminating said gate insulating film, said lower gate, and said tunneling oxide film on said PA;

forming a gate oxide film on said PA to form a third resultant structure;

forming an upper gate and an upper insulating film on a whole surface of said third resultant structure;

etching said upper insulating film and said upper gate on said CR and PA to form a gate mask and a single layer gate pattern;

etching said gate insulating film and said lower gate on said CR by using said gate mask to form a stack gate pattern of a fourth resultant structure;

forming source/drain regions on said fourth resultant structure to form a fifth resultant structure;

forming an interlayer dielectric film on a whole surface of said fifth resultant structure; and forming a metallic wiring on said interlayer dielectric film.

2. The manufacturing method of a nonvolatile memory according to claim 1, wherein said lower gate is a floating gate formed of a doped polysilicon film and said upper gate is a control gate formed of a polycide film.

3. The manufacturing method of a nonvolatile memory according to claim 1, wherein said interlayer dielectric film is formed of a high temperature oxide or a BPSG film.

4. A manufacturing method of a nonvolatile memory comprising the steps of:

forming a field oxide film on a cell region (CR) and a periphery circuit area (PA) of a semiconductor substrate to define an active region;

forming a tunneling oxide film on said active region to form a first resultant structure;

forming a lower gate on said first resultant structure;

eliminating a defined part of said lower gate on said CR to form a second resultant structure;

forming a gate insulating film on the whole surface of said second resultant structure;

eliminating said gate insulating film, said lower gate, and said tunneling oxide film on said PA;

forming a gate oxide film on said PA to form a third resultant structure;

forming an upper gate and an upper insulating film on the whole surface of said third resultant structure;

patterning said upper insulating film on said CR and PA to form a mask;

etching said upper gate by using said patterned upper insulating film as a mask to form a gate mask pattern on said CR and a single layer gate pattern on said PA;

etching said gate insulating film and said lower gate on said CR by using said gate mask pattern to form a stack gate pattern to form a fourth resultant structure;

forming source/drain regions on said fourth resultant structure to form a fifth resultant structure;

forming an interlayer dielectric film on a whole surface of said fifth resultant structure; and forming a metallic wiring on said interlayer dielectric film.

5. The manufacturing method of a nonvolatile memory according to claim 4, wherein said interlayer dielectric film is formed of a high temperature oxide or a BPSG film.

6. The manufacturing method of a nonvolatile memory according to claim 4, wherein said lower gate is a floating gate formed of a doped polysilicon film and said upper gate is a control gate formed of a polycide film.

7. The manufacturing method of a nonvolatile memory according to claim 1, wherein said upper insulating film layer is not removed after forming said lower gate on said CR.

8. The manufacturing method of a nonvolatile memory according to claim 4, wherein said upper insulating film layer is not removed after forming said lower gate on said CR.

* * * * *